(12) United States Patent
Hong

(10) Patent No.: US 12,126,353 B2
(45) Date of Patent: Oct. 22, 2024

(54) ANALOG-TO-DIGITAL CONVERSION CIRCUIT AND METHOD HAVING QUICK TRACKING MECHANISM

(71) Applicant: REALTEK SEMICONDUCTOR CORPORATION, Hsinchu (TW)

(72) Inventor: Wei-Cian Hong, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 176 days.

(21) Appl. No.: 17/945,136

(22) Filed: Sep. 15, 2022

(65) Prior Publication Data

US 2023/0188152 A1   Jun. 15, 2023

(30) Foreign Application Priority Data

Dec. 9, 2021   (TW) ................ 110146084

(51) Int. Cl.
  *H03M 1/34*   (2006.01)
  *H03M 1/08*   (2006.01)
  *H03M 1/46*   (2006.01)

(52) U.S. Cl.
  CPC .......... *H03M 1/34* (2013.01); *H03M 1/0863* (2013.01); *H03M 1/462* (2013.01); *H03M 1/468* (2013.01)

(58) Field of Classification Search
  CPC ...... H03M 1/34; H03M 1/0863; H03M 1/462; H03M 1/468
  See application file for complete search history.

(56) References Cited

U.S. PATENT DOCUMENTS

| | | | |
|---|---|---|---|
| 8,390,501 B2* | 3/2013 | Chang | H03M 1/462 341/172 |
| 8,416,116 B2* | 4/2013 | Chang | H03M 1/002 341/172 |
| 2012/0274489 A1 | 11/2012 | Chang et al. | |

FOREIGN PATENT DOCUMENTS

WO   WO2016029858 A1   3/2016

OTHER PUBLICATIONS

OA letter of a counterpart TW application (appl. No. 110146084) mailed on Jun. 17, 2022. Summary of the TW OA letter: 1. Claims 1, 5-7 are rejected as being anticipated by the disclosure of the cited reference 1 (US 2012/0274489 A1). 2. Claims 2-4 and 8-10 are allowable. Correspondence bewteen claims of TW counterpart application and claims of US application: 1. Claims 1-10 in TW counterpart application correspond to claims 1-10 in US application, respectively.

* cited by examiner

*Primary Examiner* — Khai M Nguyen
(74) *Attorney, Agent, or Firm* — WPAT, P.C

(57) ABSTRACT

The present invention discloses an analog-to-digital conversion circuit having quick tracking mechanism is provided. A positive and a negative capacitor arrays receive a positive and a negative input voltages and output a positive and a negative output voltages. A first and a second comparators performs comparison thereon respectively according to and not according to a reference voltage to generate a first and a second comparison results. A control circuit does not perform level-shifting when a difference between the positive and the negative output voltages is not within a predetermined range. The control circuit assigns the positive and the negative capacitor arrays a voltage up-tracking direction and a voltage down-tracking direction respectively to switch a capacitor enabling combination with digital codes accord- (Continued)

ing to the second comparison result, and outputs the digital codes as a digital output signal when the positive and the negative output voltages equal.

12 Claims, 7 Drawing Sheets

ANALOG-TO-DIGITAL CONVERSION CIRCUIT AND METHOD HAVING QUICK TRACKING MECHANISM

BACKGROUND OF THE INVENTION

1. Field of the Invention

The present invention relates to an analog-to-digital conversion circuit and an analog-to-digital conversion method having quick tracking mechanism.

2. Description of Related Art

An analog-to-digital conversion circuit converts a continuous analog signal or a physical quantity (usually a voltage) to a digital signal. The analog-to-digital conversion circuit can be implemented by using various configurations. A conventional digital slope analog-to-digital conversion circuit performs conversion in a linear way, in which signal level-shifting is performed after the input signal is sampled no matter what level of the input signal is such that capacitors in a capacitor array is switched step-by-step to track the input signal. As a result, such a configuration of the analog-to-digital conversion circuit has a relatively slower operation speed. The consumed conversion time is long.

SUMMARY OF THE INVENTION

In consideration of the problem of the prior art, an object of the present invention is to supply an analog-to-digital conversion circuit and an analog-to-digital conversion method having quick tracking mechanism.

The present invention discloses an analog-to-digital conversion (ADC) circuit having quick tracking mechanism that includes a positive capacitor array, a negative capacitor array, a first comparator, a second comparator and a control circuit. The positive capacitor array is configured to receive a positive input voltage and output a positive output voltage. The negative capacitor array is configured to receive a negative input voltage and output a negative output voltage. The first comparator is configured to compare the positive output voltage and the negative output voltage according to a reference voltage to generate a first comparison result. The second comparator is configured to compare the positive output voltage and the negative output voltage to generate a second comparison result. The control circuit is configured to receive the first comparison result and the second comparison result. The control circuit, in an initial stage and according to the first comparison result, does not perform level-shifting when a difference between the positive output voltage and the negative output voltage is not within a predetermined range related to the reference voltage. The control circuit assigns a voltage down-tracking direction and a voltage up-tracking direction respectively to the positive capacitor array and the negative capacitor array when the positive output voltage is larger than the negative output voltage, assigns the voltage up-tracking direction and the voltage down-tracking direction respectively to the positive capacitor array and the negative capacitor array when the negative output voltage is larger than the positive output voltage, switches a capacitor enabling combination of the positive capacitor array and the negative capacitor array according to the second comparison result in each of a plurality of switching stages after the initial stage by using a set of digital codes and outputs the corresponding set of digital codes as a digital output signal when the positive output voltage and the negative output voltage equal to each other.

The present invention also discloses an analog-to-digital conversion method having quick tracking mechanism that includes steps outlined below. A positive input voltage is received and a positive output voltage is outputted by a positive capacitor array. A negative input voltage is received and a negative output voltage is outputted by a negative capacitor array. The positive output voltage and the negative output voltage are compared according to a reference voltage to generate a first comparison result by a first comparator. The positive output voltage and the negative output voltage are compared to generate a second comparison result by a second comparator. The first comparison result and the second comparison result are received by a control circuit. In an initial stage and according to the first comparison result, level-shifting is not performed when a difference between the positive output voltage and the negative output voltage is not within a predetermined range related to the reference voltage by the control circuit. A voltage down-tracking direction and a voltage up-tracking direction are respectively assigned to the positive capacitor array and the negative capacitor array when the positive output voltage is larger than the negative output voltage, and the voltage up-tracking direction and the voltage down-tracking direction are respectively assigned to the positive capacitor array and the negative capacitor array when the negative output voltage is larger than the positive output voltage by the control circuit. A capacitor enabling combination of the positive capacitor array and the negative capacitor array is switched according to the second comparison result in each of a plurality of switching stages after the initial stage by using a set of digital codes by the control circuit. The corresponding set of digital codes are outputted as a digital output signal when the positive output voltage and the negative output voltage equal to each other by the control circuit.

These and other objectives of the present invention will no doubt become obvious to those of ordinary skill in the art behind reading the following detailed description of the preferred embodiments that are illustrated in the various figures and drawings.

DETAILED DESCRIPTION OF THE
PREFERRED EMBODIMENTS

An aspect of the present invention is to provide an analog-to-digital conversion circuit and an analog-to-digital conversion method having quick tracking mechanism to determine whether level-shifting is performed according to a difference between a positive output voltage and a negative output voltage such that the level-shifting is not performed when the difference is larger to speed up the operation process.

Figure 1:
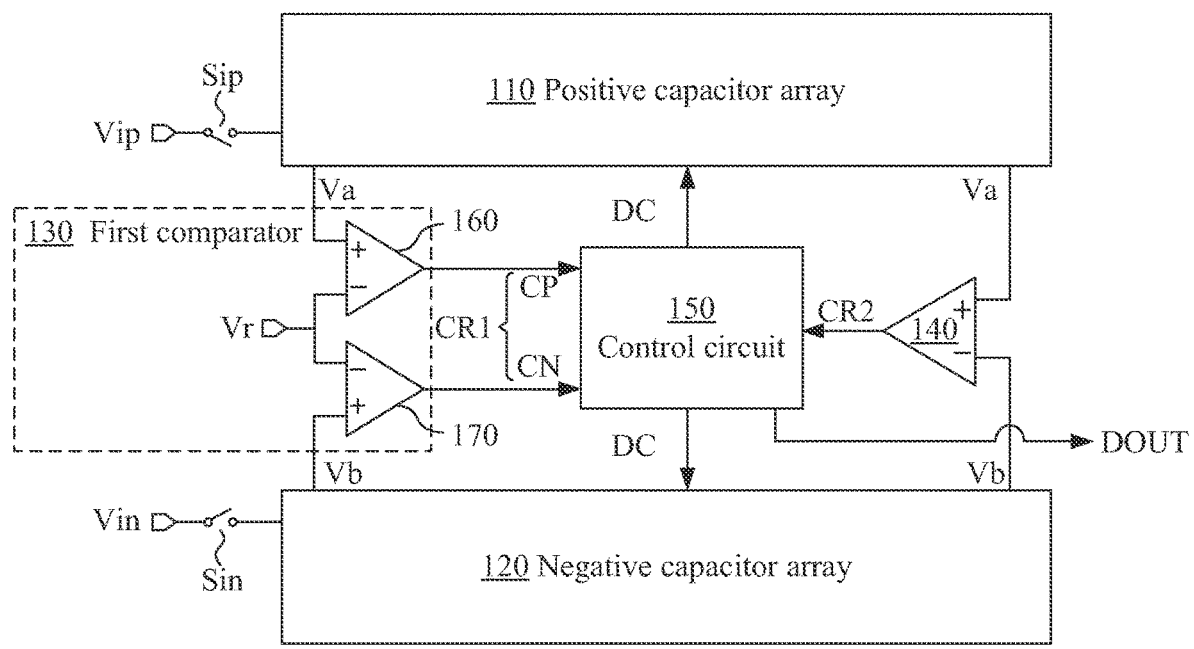
FIG. 1 illustrates a block diagram of a analog-to-digital conversion circuit having quick tracking mechanism according to an embodiment of the present invention.

Reference is now made to FIG. 1. FIG. 1 illustrates a block diagram of a analog-to-digital conversion circuit 100 having quick tracking mechanism according to an embodiment of the present invention. The analog-to-digital conversion circuit 100 includes a positive capacitor array 110, a negative capacitor array 120, a first comparator 130, a second comparator 140 and a control circuit 150.

The positive capacitor array 110 receives a positive input voltage Vip and outputs a positive output voltage Va. More specifically, in an embodiment, the positive capacitor array 110 is connected to an analog signal source through a switch Sip to receive the positive input voltage Vip in a sampling stage. When the sampling stage is finished, the switch Sip is disconnected from the analog signal source such that the positive capacitor array 110 switches a capacitor enabling combination therein to generate the positive output voltage Va.

The negative capacitor array 120 receives a negative input voltage Vin and outputs a negative output voltage Vb. More specifically, in an embodiment, the negative capacitor array 120 is connected to an analog signal source through a switch Sin to receive the negative input voltage Vin in the sampling stage. When the sampling stage is finished, the switch Sin is disconnected from the analog signal source such that the negative capacitor array 120 switches a capacitor enabling combination therein to generate the negative output voltage Vb.

The first comparator 130 compares the positive output voltage Va and the negative output voltage Vb according to a reference voltage Vr to generate a first comparison result CR1.

The second comparator 140 compares the positive output voltage Va and the negative output voltage Vb to generate the second comparison result CR2.

The control circuit 150 receives the first comparison result CR1 and the second comparison result CR2 and control the switching of the capacitor enabling combination of the positive capacitor array 110 and the negative capacitor array 120 accordingly.

The control circuit 150, in an initial stage and according to the first comparison result CR1 generated by the first comparator 130, determines whether a difference between the positive output voltage Va and the negative output voltage Vb is within a predetermined range related to the reference voltage Vr, so as to further determine whether a level-shifting performed.

In an embodiment, the first comparator 130 includes a positive terminal comparator 160 and a negative terminal comparator 170. The positive terminal comparator 160 compares the positive output voltage Va and the reference voltage Vr to generate a positive terminal comparison result CP included in the first comparison result CR1. The negative terminal comparator 170 compares the negative input voltage Vb and the reference voltage Vr to generate a negative terminal comparison result CN included in the first comparison result CR1.

The control circuit 150 set a range between a positive value and a negative value of the reference voltage Vr to be the predetermined range and determine whether the difference between the positive output voltage Va and the negative input voltage Vb is within the predetermined range according to the first comparison result CR1. More specifically, when the difference is represented by Vi, the condition that the difference is within the predetermined range is represented by $-Vr \leq Vi \leq Vr$. The condition that the difference is not within the predetermined range is represented by either $Vi<-Vr$ or $Vi>Vr$. In a numerical example, the reference voltage Vr can be such as, but not limited to 100 millivolts (mV).

It is appreciated that the configuration of the first comparator 130 and the setting of the predetermined range described above are merely an example. In other embodiments, other configurations can be used to implement the first comparator 130 and other values can be set to the predetermined range to compare the difference between the positive output voltage Va and the negative input voltage Vb.

The operation of the analog-to-digital conversion circuit 100 under the condition that the difference between the positive output voltage Va and the negative output voltage Vb is not within the predetermined range is described in the following paragraphs.

When the difference between the positive output voltage Va and the negative output voltage Vb is not within the predetermined range and thus has a larger value, the control circuit 150 determines that either the positive output voltage Va is far larger than the negative output voltage Vb (Va>>Vb) or the negative output voltage Vb is far larger than the positive output voltage Va (Vb>>Va). As a result, the control circuit 150 determines that a larger difference already exists between the positive output voltage Va and the negative output voltage Vb and determines that the level-shifting is not performed.

When the positive output voltage Va is larger than the negative output voltage Vb, the control circuit 150 assigns a voltage down-tracking direction to the positive capacitor array 110 and assigns a voltage up-tracking direction to the negative capacitor array 120. When the negative output voltage Vb is larger than the positive output voltage Va, the control circuit 150 assigns the voltage up-tracking direction to the positive capacitor array 110 and assigns the voltage down-tracking direction to the negative capacitor array 120.

Moreover, the control circuit 150 switches the capacitor enabling combination of the positive capacitor array 110 and the negative capacitor array 120 according to the second comparison result CR2 in each of a plurality of switching stages after the initial stage by using a set of digital codes DC and outputs the corresponding set of digital codes DC as a digital output signal DOUT when the positive output voltage Va and the negative output voltage Vb equal to each other.

More specifically, in the initial stage, the capacitors in the positive capacitor array 110 and the negative capacitor array 120 are all disabled. After receiving the positive input voltage Vip and the negative input voltage Vin, the control circuit 150 keeps adjusting the set of digital codes DC according to the first comparison result CR1 to switch the capacitor enabling combination of the positive capacitor array 110 and the negative capacitor array 120. In an embodiment, the set of digital codes DC switch the capacitors included in the positive capacitor array 110 and the negative capacitor array 120 in a form of thermometer codes.

When a set of digital codes DC exists that make the positive output voltage Va and the negative output voltage Vb equal to each other, such a set of digital codes DC are the analog-to-digital conversion result of the positive input voltage Vip and the negative input voltage Vin and are outputted as the digital output signal DOUT.

It is appreciated that in practical implementation, the term "equal" means that the difference between the positive output voltage Va and the negative output voltage Vb is smaller than a specific range, such as but not limited to the size of the least significant bit (LSB). As a result, the control circuit 150 can output the set of digital codes as the digital output signal DOUT when the difference between the positive output voltage Va and the negative output voltage Vb is smaller than the size of the least significant bit.

Figure 2:
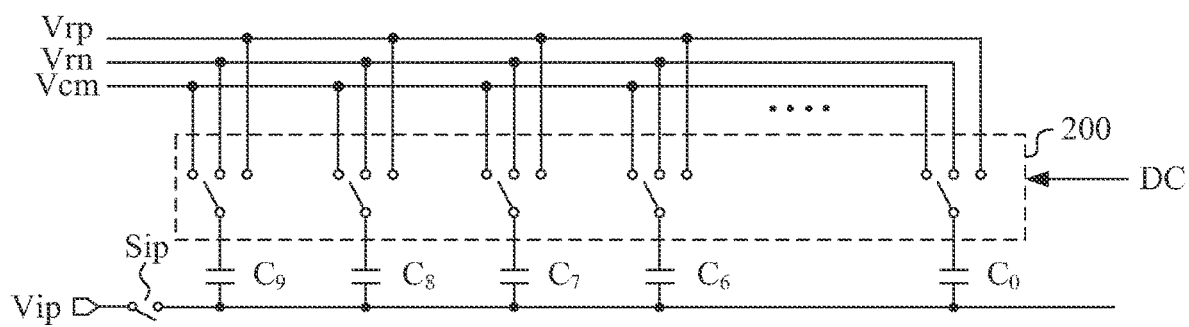
FIG. 2 illustrates a more detailed circuit diagram of the positive capacitor array according to an embodiment of the present invention.

Reference is now made to FIG. 2. FIG. 2 illustrates a more detailed circuit diagram of the positive capacitor array 110 according to an embodiment of the present invention. The operation of the capacitor array assigned to either the voltage down-tracking direction or the voltage up-tracking direction is described by using the positive capacitor array 110 as an example in the following paragraphs in accompany with FIG. 2.

The positive capacitor array 110 includes a plurality of capacitors and a capacitor switching circuit 200.

In the present embodiment, the positive capacitor array 110 includes capacitors C0~C9. Each of the capacitor C0~C9 has a first terminal and a second terminal. The first terminal receives the positive input voltage Vip and outputs the positive output voltage Va.

The capacitor switching circuit 200 is electrically coupled to the capacitors and is configured to electrically couple the second terminal to a common mode voltage Vcm in the initial stage. The capacitor switching circuit 200, in each of the switching stages after the initial stage and according to the second comparison result CR2, is further configured to electrically couple the second terminal of at least one of the capacitors C0~C9 to a negative reference voltage Vrn to enable the capacitors when being corresponding to the voltage down-tracking direction, and electrically couple the second terminal of at least one of the capacitors C0~C9 to a positive reference voltage Vrp to enable the capacitors when being corresponding to the voltage up-tracking direction by using the set of digital codes DC.

It is appreciated that besides receiving the negative input voltage Vin from the first terminal and outputting the negative output voltage Vb, the negative capacitor array 120 includes the same configuration as that of the positive capacitor array 110 and operates in an identical manner. As a result, the detail related to the negative capacitor array 120 is not described herein.

Figure 3:
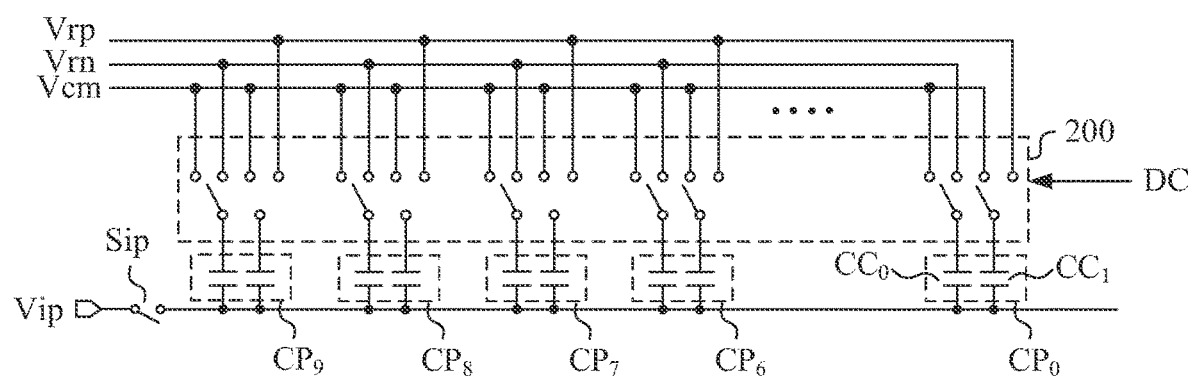
FIG. 3 illustrates a more detailed circuit diagram of the positive capacitor array according to another embodiment of the present invention.

Reference is now made to FIG. 3. FIG. 3 illustrates a more detailed circuit diagram of the positive capacitor array 110 according to another embodiment of the present invention. The configuration of the capacitor array and the quick tracking mechanism thereof are described by using the positive capacitor array 110 as an example in the following paragraphs in accompany with FIG. 3. The configuration and the operation of the negative capacitor array 120 are identical to those of the positive capacitor array 110 and are not described herein.

The positive capacitor array 110 includes a plurality of capacitor pairs and the capacitor switching circuit 200.

In the present embodiment, the positive capacitor array 110 includes capacitor pairs CP0~CP9. Each of the capacitor pairs CP0~CP9 has a first unit capacitor CC0 and a second unit capacitor CC1 having the same capacitance. Each of the first unit capacitor CC0 and the second unit capacitor CC1 has a first terminal and a second terminal. The first terminal receives the positive input voltage Vip and outputs the positive output voltage Va.

The capacitor switching circuit 200 is electrically coupled to the capacitor pairs described above and is configured to electrically couple the second terminal of the first unit capacitor CC0 and the second unit capacitor CC1 of each of the capacitor pairs CP0~CP9 to the common mode voltage Vcm in the initial stage. The capacitor switching circuit 200, in each of the switching stages after the initial stage and according to the second comparison result CR2, is further configured to electrically couple the second terminal of the first unit capacitor CC0 of at least one of the capacitor pairs to the negative reference voltage Vrn to enable the capacitor pairs when being corresponding to the voltage down-tracking direction, and electrically couple the second terminal of the second unit capacitor CC1 of at least one of the capacitor pairs to the positive reference voltage Vrp to enable the capacitor pairs when being corresponding to the voltage up-tracking direction by using the set of digital codes DC.

It is appreciated that besides receiving the negative input voltage Vin from the first terminal and outputting the negative output voltage Vb, the negative capacitor array 120 includes the same configuration as that of the positive capacitor array 110 and operates in an identical manner. As a result, the detail related to the negative capacitor array 120 is not described herein.

Further, the number of the capacitors and the number of the capacitor pairs described above are merely an example. In other embodiments, the number of the capacitors and the number of the capacitor pairs can be any number that is two or more than two.

Figure 4A:
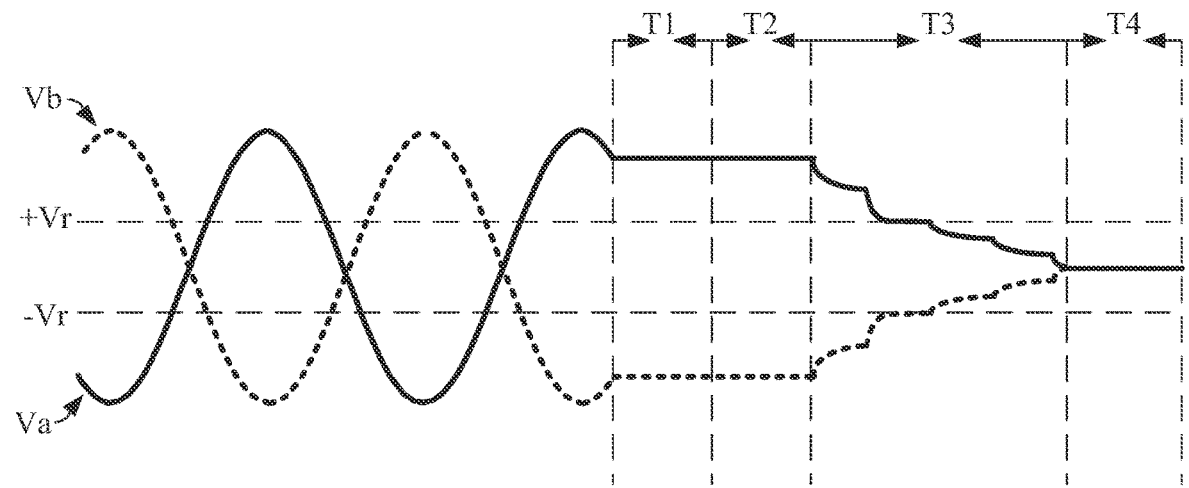
FIG. 4A and FIG. 4B are diagrams illustrating the variation of the positive output voltage and the negative output voltage along with the operation of analog-to-digital conversion circuit in FIG. 1 according to an embodiment of the present invention.
Figure 4B:
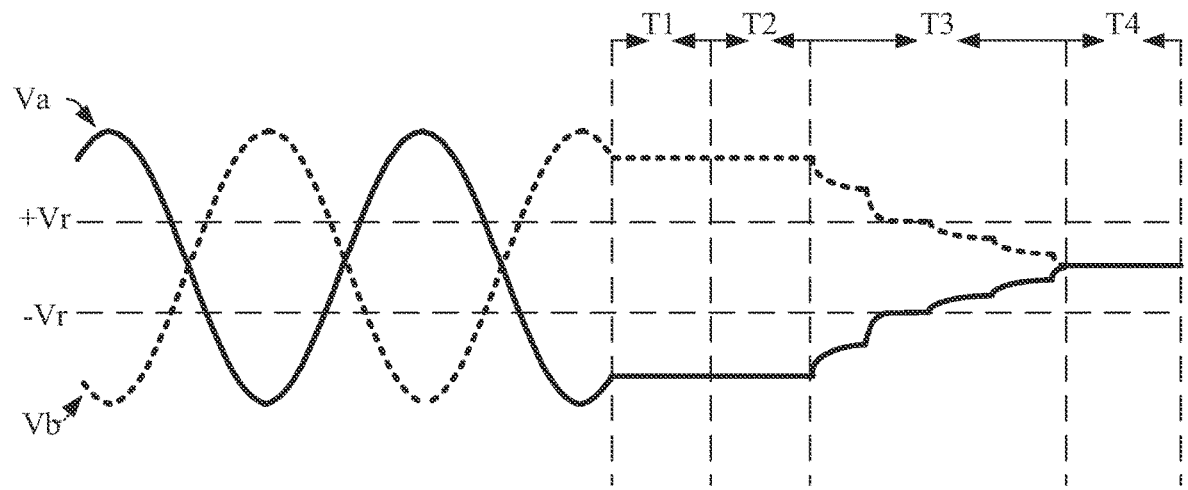

Reference is now made to both FIG. 4A and FIG. 4B. FIG. 4A and FIG. 4B are diagrams illustrating the variation of the positive output voltage Va and the negative output voltage Vb along with the operation of analog-to-digital conversion circuit 100 in FIG. 1 according to an embodiment of the present invention. In FIG. 4A and FIG. 4B, the positive output voltage Va is illustrated as a solid line section and the negative output voltage Vb is illustrated as a dotted line section.

As illustrated in FIG. 4A and FIG. 4B, a time interval T1 corresponds to a sampling-finished stage. The positive capacitor array 110 and the negative capacitor array 120 in FIG. 1 receive the positive input voltage Vip and the negative input voltage Vin through the switch Sip and Sin respectively, such that the positive output voltage Va and the negative output voltage Vb respectively equal to the positive input voltage Vip and the negative input voltage Vin. Subsequently, the switch Sip and Sin are disconnected such that each of the positive input voltage Vip and the negative input voltage Vin is no longer a sine wave. The second terminal of each of the capacitors in the positive capacitor array 110 and the negative capacitor array 120 is electrically coupled to the common mode voltage Vcm and is therefore disabled. Under such a condition, the sampling is finished.

A time interval T2 corresponds to an initial stage. Under such a condition, the control circuit 150 determines that the difference between the positive output voltage Va and the negative output voltage Vb is not within the predetermined range related to the reference voltage Vr according to the first comparison result CR1 generated by the first comparator 130 and further determines the level-shifting is not performed. FIG. 4A and FIG. 4B illustrate both of the positive value +Vr and the negative value −Vr of the reference voltage Yr.

A time interval T3 corresponds to the plurality of switching stages after the initial stage. In FIG. 4A, since the positive output voltage Va is larger than the negative output voltage Vb, the control circuit 150 assigns the voltage down-tracking direction to the positive capacitor array 110 and assigns the voltage up-tracking direction to the negative capacitor array 120. On the contrary, in FIG. 4B, since the negative output voltage Vb is larger than the positive output voltage Va, the control circuit 150 assigns the voltage up-tracking direction to the positive capacitor array 110 and assigns the voltage down-tracking direction to the negative capacitor array 120.

Moreover, the control circuit 150, in each of the switching stages and according to the second comparison result CR2 generated by the second comparator 140, switches the positive capacitor array 110 and the negative capacitor array 120 by using the set of digital codes DC.

In a time interval T4, the positive output voltage Va and the negative output voltage Vb equals to each other such that the control circuit 150 in FIG. 1 generates the digital output signal DOUT.

The operation of the analog-to-digital conversion circuit 100 under the condition that the difference between the positive output voltage Va and the negative output voltage Vb is within the predetermined range is described in the following paragraphs.

When the difference between the positive output voltage Va and the negative output voltage Vb is within the predetermined range and thus has a smaller value, the control circuit 150 determines that either the positive output voltage Va is slightly larger than the negative output voltage Vb (Va>Vb) or the negative output voltage Vb is slightly larger than the positive output voltage Va (Vb>Va). As a result, the control circuit 150 that a smaller difference exists between the positive output voltage Va and the negative output voltage Vb and determines that the level-shifting is required to be performed. The level-shifting can be performed by using such as, but not limited to the variation of the common mode voltage provided to the positive capacitor array 110 and negative capacitor array 110.

In an embodiment, the control circuit 150 performs positive level-shifting on a larger one of the positive output voltage Va and the negative output voltage Vb, performs negative level-shifting on a smaller one of and the positive output voltage Va and the negative output voltage Vb.

Further, same as the operation performed when the difference between the positive output voltage Va and the negative input voltage Vb is within the predetermined range described above, the control circuit 150 assigns the voltage down-tracking direction to the positive capacitor array 110 and assigns the voltage up-tracking direction to the negative capacitor array 120 when the positive output voltage Va is larger than the negative output voltage Vb. The control circuit 150 assigns the voltage up-tracking direction to the positive capacitor array 110 and assigns the voltage down-tracking direction to the negative capacitor array 120 when the negative output voltage Vb is larger than the positive output voltage Va. In each of the switching stages after the initial stage and according to the second comparison result CR2, the control circuit 150 switches the capacitor enabling combination of the positive capacitor array 110 and the negative capacitor array 120 by using the set of digital codes DC.

Figure 5A:
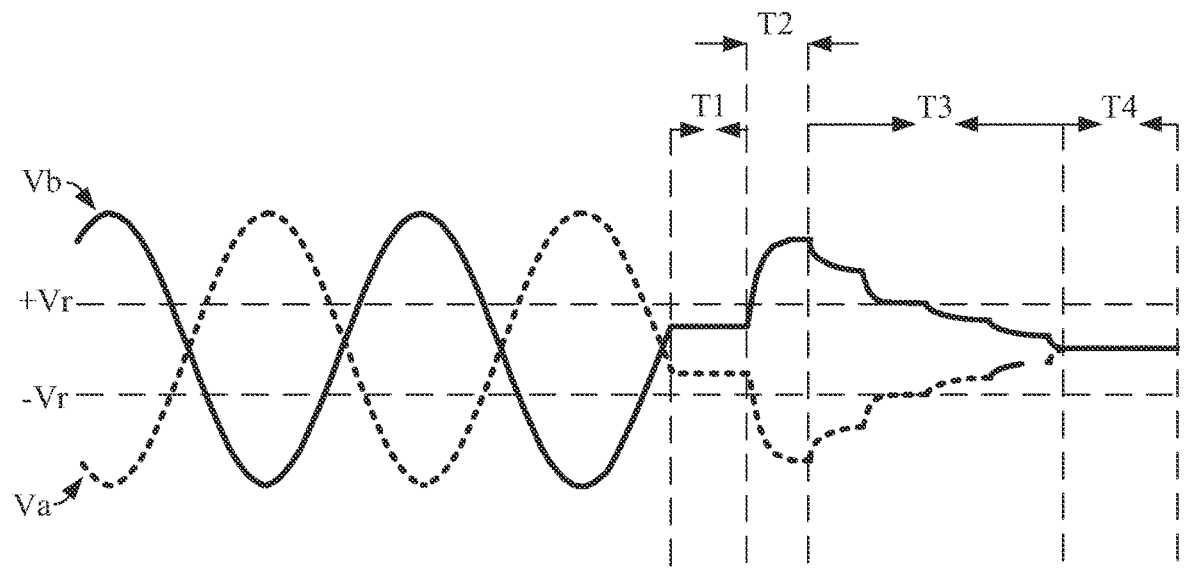
FIG. 5A and FIG. 5B are diagrams illustrating the variation of the positive output voltage and the negative output voltage along with the operation of analog-to-digital conversion circuit in FIG. 1 according to another embodiment of the present invention.
Figure 5B:
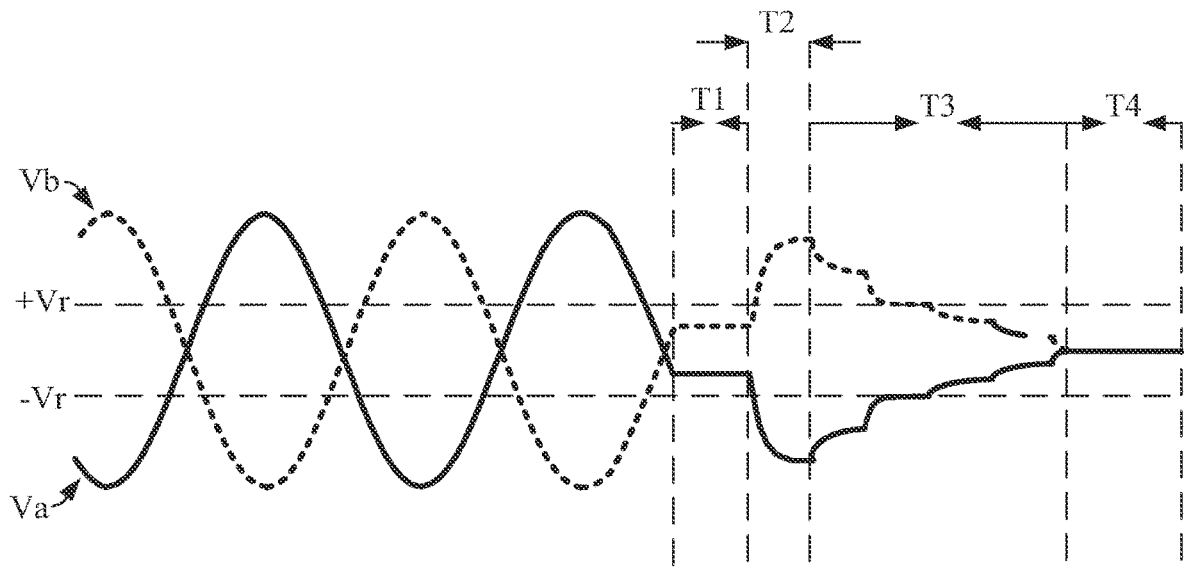

Reference is now made to both FIG. 5A and FIG. 5B. FIG. 5A and FIG. 5B are diagrams illustrating the variation of the positive output voltage Va and the negative output voltage Vb along with the operation of analog-to-digital conversion circuit 100 in FIG. 1 according to another embodiment of the present invention. In FIG. 5A and FIG. 5B, the positive output voltage Va is illustrated as a solid line section and the negative output voltage Vb is illustrated as a dotted line section.

As illustrated in FIG. 5A and FIG. 5B, the time interval T1 corresponds to the sampling-finished stage and the time interval T2 corresponds to the initial stage. The control circuit 150 determines that the difference between the positive output voltage Va and the negative output voltage Vb is within the predetermined range related to the reference voltage Vr according to the first comparison result CR1 generated by the first comparator 130 and further determines the level-shifting is required to be performed. The positive level-shifting is performed on the larger one of the positive output voltage Va and the negative output voltage Vb. The negative level-shifting is performed on the smaller one of the positive output voltage Va and the negative output voltage Vb.

The time interval T3 corresponds to the plurality of switching stages after the initial stage. In FIG. 5A, since the positive output voltage Va is larger than the negative output voltage Vb, the control circuit 150 assigns the voltage down-tracking direction to the positive capacitor array 110 and assigns the voltage up-tracking direction to the negative capacitor array 120. On the contrary, in FIG. 5B, since the negative output voltage Vb is larger than the positive output voltage Va, the control circuit 150 assigns the voltage up-tracking direction to the positive capacitor array 110 and assigns the voltage down-tracking direction to the negative capacitor array 120.

Moreover, the control circuit 150, in each of the switching stages and according to the second comparison result CR2 generated by the second comparator 140, switches the positive capacitor array 110 and the negative capacitor array 120 by using the set of digital codes DC.

In the time interval T4, the positive output voltage Va and the negative output voltage Vb equals to each other such that the control circuit 150 in FIG. 1 generates the digital output signal DOUT.

In another embodiment, the control circuit 150 performs positive level-shifting on the positive output voltage Va, and performs negative level-shifting on the negative output voltage Vb such that the positive output voltage Va is larger than the negative output voltage Vb.

Moreover, the control circuit 150 assigns the voltage down-tracking direction to the positive capacitor array 110 and assigns the voltage up-tracking direction to the negative capacitor array 120. Moreover, the control circuit 150, in each of the switching stages and according to the second comparison result CR2 generated by the second comparator 140, switches the positive capacitor array 110 and the negative capacitor array 120 by using the set of digital codes DC.

Figure 6A:
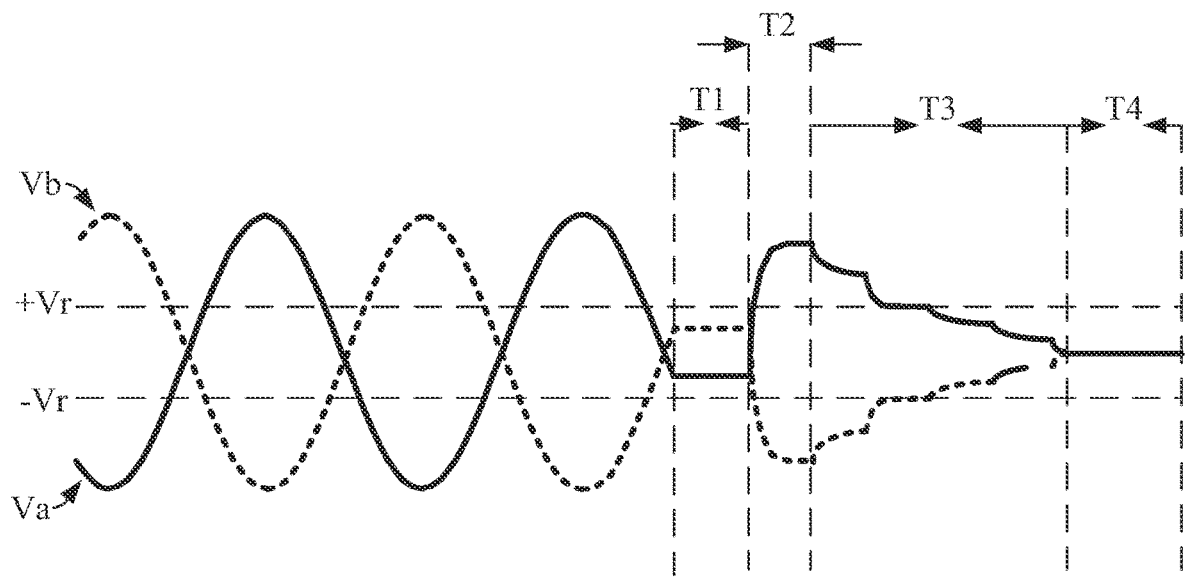
FIG. 6A and FIG. 6B are diagrams illustrating the variation of the positive output voltage and the negative output voltage along with the operation of analog-to-digital conversion circuit in FIG. 1 according to yet another embodiment of the present invention.
Figure 6B:
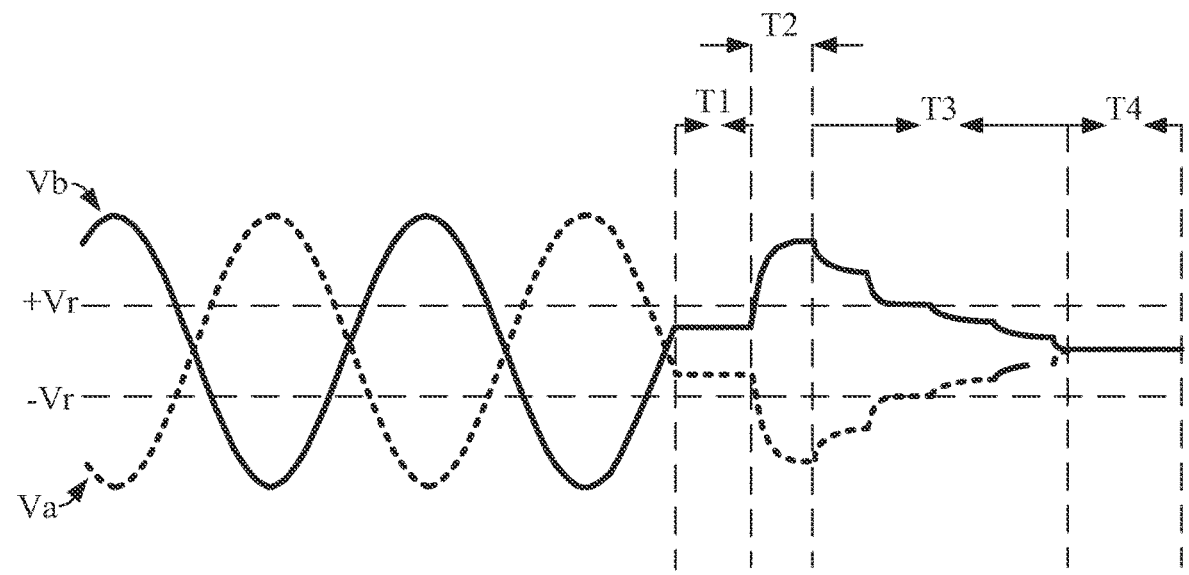

Reference is now made to both FIG. 6A and FIG. 6B. FIG. 6A and FIG. 6B are diagrams illustrating the variation of the positive output voltage Va and the negative output voltage Vb along with the operation of analog-to-digital conversion circuit 100 in FIG. 1 according to yet another embodiment of the present invention. In FIG. 6A and FIG. 6B, the positive output voltage Va is illustrated as a solid line section and the negative output voltage Vb is illustrated as a dotted line section.

As illustrated in FIG. 6A and FIG. 6B, the time interval T1 corresponds to the sampling-finished stage and the time interval T2 corresponds to the initial stage. The control circuit 150 determines that the difference between the positive output voltage Va and the negative output voltage Vb is within the predetermined range related to the reference voltage Vr according to the first comparison result CR1 generated by the first comparator 130 and further determines the level-shifting is required to be performed. The positive level-shifting is performed on the positive output voltage Va and the negative level-shifting is performed on the negative output voltage Vb such that the positive output voltage Va is larger than the negative output voltage Vb.

The time interval T3 corresponds to the plurality of switching stages after the initial stage. In FIG. 6A and FIG. 6B, the control circuit 150 assigns the voltage down-tracking direction to the positive capacitor array 110 and assigns the voltage up-tracking direction to the negative capacitor array 120.

Moreover, the control circuit 150, in each of the switching stages and according to the second comparison result CR2 generated by the second comparator 140, switches the positive capacitor array 110 and the negative capacitor array 120 by using the set of digital codes DC.

In the time interval T4, the positive output voltage Va and the negative output voltage Vb equals to each other such that the control circuit 150 in FIG. 1 generates the digital output signal DOUT.

As a result, the analog-to-digital conversion circuit of the present invention determines whether level-shifting is performed according to a difference between a positive output voltage and a negative output voltage such that the level-shifting is not performed when the difference is larger to speed up the operation process.

Figure 7:
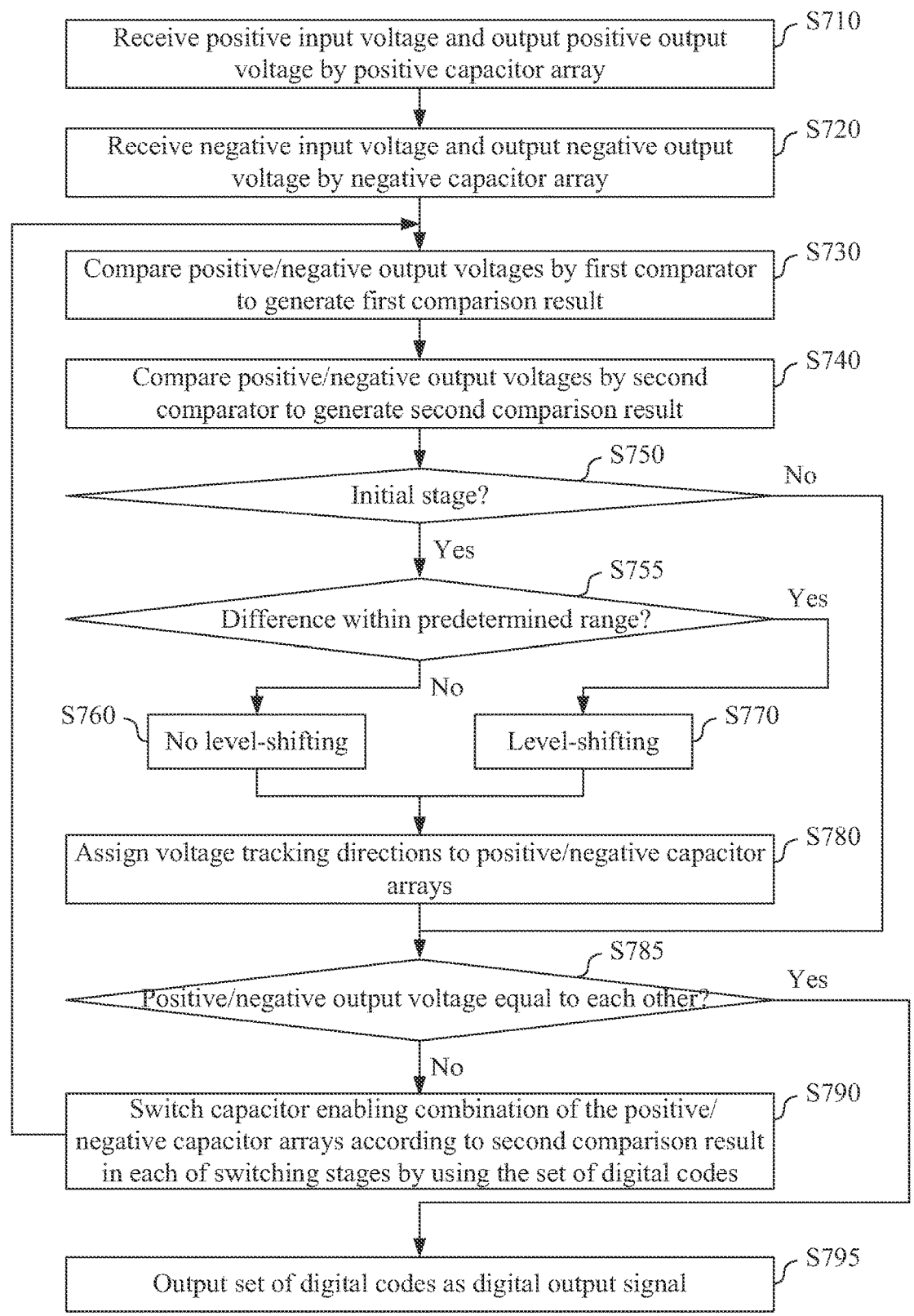
FIG. 7 illustrates a flow chart of an analog-to-digital conversion method having quick tracking mechanism according to an embodiment of the present invention.

Reference is now made to FIG. 7. FIG. 7 illustrates a flow chart of an analog-to-digital conversion method 700 having quick tracking mechanism according to an embodiment of the present invention.

In addition to the apparatus described above, the present disclosure further provides the analog-to-digital conversion method 700 having quick tracking mechanism that can be used in such as, but not limited to, the analog-to-digital conversion circuit 100 in FIG. 1. As illustrated in FIG. 7, an embodiment of the analog-to-digital conversion method 700 includes the following steps.

In step S710, the positive input voltage Vip is received and the positive output voltage Va is outputted by the positive capacitor array 110.

In step S720, the negative input voltage Vip is received and the negative output voltage Vb is outputted by the negative capacitor array 120.

In step S730, the positive output voltage Va and the negative output voltage Vb are compared by the first comparator 130 to generate the first comparison result CR1.

In step S740, the positive output voltage Va and the negative output voltage Vb are compared by the second comparator 140 to generate the second comparison result CR2.

In step S750, whether an initial stage is performed is determined.

In step S755, when the initial stage is performed, whether the difference between the positive output voltage Va and the negative output voltage Vb is within the predetermined range related to the reference voltage is determined by the control circuit 150 according to the first comparison result CR1.

In step S760, when the difference between the positive output voltage Va and the negative output voltage Vb is not within the predetermined range, level-shifting is not performed on the positive output voltage Va and the negative output voltage Vb by the control circuit 150.

In step S770, when the difference between the positive output voltage Va and the negative output voltage Vb is within the predetermined range, level-shifting is performed on the positive output voltage Va and the negative output voltage Vb by the control circuit 150.

In step S780, voltage tracking directions are assigned to the positive capacitor array 110 and the negative capacitor array 120 by the control circuit 150.

More specifically, the control circuit 150 assigns the voltage down-tracking direction to the positive capacitor array 110 and assigns the voltage up-tracking direction to the negative capacitor array 120 when the positive output voltage Va is larger than the negative output voltage Vb. The control circuit 150 assigns the voltage up-tracking direction to the positive capacitor array 110 and assigns the voltage down-tracking direction to the negative capacitor array 120 when the negative output voltage Vb is larger than the positive output voltage Va.

In step S785, when the initial stage is not performed, whether the positive output voltage Va and the negative output voltage Vb equal to each other is determined according to second comparison result CR by the control circuit 150.

In step S790, when the positive output voltage Va and the negative output voltage Vb do not equal to each other, the capacitor enabling combination of the positive capacitor array 110 and the negative capacitor array 120 is switched according to the second comparison result CR2 in each of the switching stages by using the set of digital codes DC by the control circuit 150. The flow goes back to step S730 to keep performing comparison.

In step S795, when the positive output voltage Va and the negative output voltage Vb equal to each other, the set of digital codes DC as the digital output signal DOUT by the control circuit 150.

It is appreciated that the embodiments described above are merely an example. In other embodiments, it should be appreciated that many modifications and changes may be made by those of ordinary skill in the art without departing from the spirit of the disclosure.

In summary, the present invention discloses the analog-to-digital conversion circuit and the analog-to-digital conversion method having quick tracking mechanism that determine whether level-shifting is performed according to a difference between a positive output voltage and a negative output voltage such that the level-shifting is not performed when the difference is larger to speed up the operation process.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. An analog-to-digital conversion (ADC) circuit having quick tracking mechanism, comprising:
    a positive capacitor array configured to receive a positive input voltage and output a positive output voltage;
    a negative capacitor array configured to receive a negative input voltage and output a negative output voltage;
    a first comparator configured to compare the positive output voltage and the negative output voltage according to a reference voltage to generate a first comparison result;
    a second comparator configured to compare the positive output voltage and the negative output voltage to generate a second comparison result; and
    a control circuit configured to receive the first comparison result and the second comparison result;
    wherein the control circuit, in an initial stage and according to the first comparison result, does not perform level-shifting when a difference between the positive output voltage and the negative output voltage is not within a predetermined range related to the reference voltage;
    the control circuit assigns a voltage down-tracking direction and a voltage up-tracking direction respectively to the positive capacitor array and the negative capacitor array when the positive output voltage is larger than the negative output voltage, assigns the voltage up-tracking direction and the voltage down-tracking direction respectively to the positive capacitor array and the negative capacitor array when the negative output voltage is larger than the positive output voltage, switches a capacitor enabling combination of the positive capacitor array and the negative capacitor array according to the second comparison result in each of a plurality of switching stages after the initial stage by using a set of digital codes and outputs the corresponding set of digital codes as a digital output signal when the positive output voltage and the negative output voltage equal to each other.

2. The analog-to-digital conversion circuit of claim 1, wherein the first comparator comprises:
    a positive terminal comparator configured to compare the positive output voltage and the reference voltage to generate a positive terminal comparison result comprised by the first comparison result; and
    a negative terminal comparator configured to compare the negative output voltage and the reference voltage to generate a negative terminal comparison result comprised by the first comparison result;
    wherein the control circuit is configured to set a range between a positive value and a negative value of the reference voltage to be the predetermined range and determine whether the difference between the positive output voltage and the negative output voltage is within the predetermined range according to the first comparison result.

3. The analog-to-digital conversion circuit of claim 1, wherein each of the positive capacitor array and the negative capacitor array comprises:
    a plurality of capacitors each having a first terminal and a second terminal, the first terminal is configured to receive the positive input voltage or the negative input voltage and output the positive output voltage or the negative output voltage; and
    a capacitor switching circuit electrically coupled to the capacitors and configured to electrically couple the second terminal to a common mode voltage in the initial stage;
    the capacitor switching circuit, in each of the switching stages after the initial stage and according to the second comparison result, is further configured to electrically couple the second terminal of at least one of the capacitors to a negative reference voltage to enable the capacitor when being corresponding to the voltage down-tracking direction and electrically couple the second terminal of at least one of the capacitors to a positive reference voltage to enable the capacitor when being corresponding to the voltage up-tracking direction by using the set of digital codes.

4. The analog-to-digital conversion circuit of claim 1, wherein each of the positive capacitor array and the negative capacitor array comprises:
    a plurality of capacitor pairs each having a first unit capacitor and a second unit capacitor having the same capacitance, wherein each of the first unit capacitor and the second unit capacitor has a first terminal and a second terminal, the first terminal being configured to receive the positive input voltage or the negative input voltage and output the positive output voltage or the negative output voltage;
    a capacitor switching circuit electrically coupled to the capacitor pairs and configured to electrically couple the second terminal of the first unit capacitor and the second unit capacitor of each of the capacitor pairs to a common mode voltage in the initial stage;
    the capacitor switching circuit, in each of the switching stages after the initial stage and according to the second comparison result, is further configured to electrically couple the second terminal of the first unit capacitor of at least one of the capacitor pairs to a negative reference voltage to enable the capacitor pairs when being corresponding to the voltage down-tracking direction and electrically couple the second terminal of the second unit capacitor of at least one of the capacitor pairs to a positive reference voltage to enable the capacitor pairs when being corresponding to the voltage up-tracking direction by using the set of digital codes.

5. The analog-to-digital conversion circuit of claim 1, wherein in the initial stage and according to the first comparison result, the control circuit performs positive level-shifting on a larger one of the positive output voltage and the negative output voltage and performs negative level-shifting on a smaller one of the positive output voltage and the negative output voltage when the difference between the positive output voltage and the negative output voltage is within the predetermined range related to the reference voltage;
    the control circuit assigns the voltage down-tracking direction and the voltage up-tracking direction respectively to the positive capacitor array and the negative capacitor array when the positive output voltage is larger than the negative output voltage, assigns the voltage up-tracking direction and the voltage down-tracking direction respectively to the positive capacitor array and the negative capacitor array when the negative output voltage is larger than the positive output voltage, and switches a capacitor enabling combination of the positive capacitor array and the negative capacitor array according to the second comparison result in each of the switching stages after the initial stage by using the set of digital codes.

6. The analog-to-digital conversion circuit of claim 1, wherein in the initial stage and according to the first comparison result, the control circuit performs positive level-shifting on the positive output voltage and performs negative level-shifting on the negative output voltage when the difference between the positive output voltage and the negative output voltage is within the predetermined range related to the reference voltage such that the positive output voltage is larger than the negative output voltage;

the control circuit assigns the voltage down-tracking direction and the voltage up-tracking direction respectively to the positive capacitor array and the negative capacitor array and switches a capacitor enabling combination of the positive capacitor array and the negative capacitor array according to the second comparison result in each of the switching stages after the initial stage by using the set of digital codes.

7. An analog-to-digital conversion method having quick tracking mechanism, comprising:

receiving a positive input voltage and outputting a positive output voltage by a positive capacitor array;

receiving a negative input voltage and outputting a negative output voltage by a negative capacitor array;

comparing the positive output voltage and the negative output voltage according to a reference voltage to generate a first comparison result by a first comparator;

comparing the positive output voltage and the negative output voltage to generate a second comparison result by a second comparator;

receiving the first comparison result and the second comparison result by a control circuit;

in an initial stage and according to the first comparison result, not performing level-shifting when a difference between the positive output voltage and the negative output voltage is not within a predetermined range related to the reference voltage by the control circuit;

assigning a voltage down-tracking direction and a voltage up-tracking direction respectively to the positive capacitor array and the negative capacitor array when the positive output voltage is larger than the negative output voltage, and assigning the voltage up-tracking direction and the voltage down-tracking direction respectively to the positive capacitor array and the negative capacitor array when the negative output voltage is larger than the positive output voltage by the control circuit;

switching a capacitor enabling combination of the positive capacitor array and the negative capacitor array according to the second comparison result in each of a plurality of switching stages after the initial stage by using a set of digital codes by the control circuit; and outputting the corresponding set of digital codes as a digital output signal when the positive output voltage and the negative output voltage equal to each other by the control circuit.

8. The analog-to-digital conversion method of claim 7, further comprising:

comparing the positive output voltage and the reference voltage to generate a positive terminal comparison result comprised by the first comparison result by a positive terminal comparator comprised by the first comparator;

comparing the negative output voltage and the reference voltage to generate a negative terminal comparison result comprised by the first comparison result by a negative terminal comparator comprised by the first comparator; and setting a range between a positive value and a negative value of the reference voltage to be the predetermined range and determining whether the difference between the positive output voltage and the negative output voltage is within the predetermined range according to the first comparison result by the control circuit.

9. The analog-to-digital conversion method of claim 7, wherein each of the positive capacitor array and the negative capacitor array comprises a plurality of capacitors and a capacitor switching circuit, each of the capacitors has a first terminal and a second terminal, and the capacitor switching circuit is electrically coupled to the capacitors, the analog-to-digital conversion method further comprises:

receiving the positive input voltage or the negative input voltage and outputting the positive output voltage or the negative output voltage by the first terminal of the capacitors;

electrically coupling the second terminal to a common mode voltage in the initial stage by the capacitor switching circuit; and in each of the switching stages after the initial stage and according to the second comparison result, electrically coupling the second terminal of at least one of the capacitors to a negative reference voltage to enable the capacitor when being corresponding to the voltage down-tracking direction and electrically coupling the second terminal of at least one of the capacitors to a positive reference voltage to enable the capacitor when being corresponding to the voltage up-tracking direction by using the set of digital codes by the capacitor switching circuit.

10. The analog-to-digital conversion method of claim 7, wherein each of the positive capacitor array and the negative capacitor array comprises a plurality of capacitor pairs and a capacitor switching circuit, each of the capacitor pairs has a first unit capacitor and a second unit capacitor having the same capacitance, each of the first unit capacitor and the second unit capacitor has a first terminal and a second terminal and the capacitor switching circuit is electrically coupled to the capacitor pairs, the analog-to-digital conversion method further comprises:

receiving the positive input voltage or the negative input voltage and outputting the positive output voltage or the negative output voltage by the first terminal of the first unit capacitor and the second unit capacitor of the capacitor pairs;

electrically coupling the second terminal of the first unit capacitor and the second unit capacitor of each of the capacitor pairs to a common mode voltage in the initial stage by the capacitor switching circuit; and in each of the switching stages after the initial stage and according to the second comparison result, electrically coupling the second terminal of the first unit capacitor of at least one of the capacitor pairs to a negative reference voltage to enable the capacitor pairs when being corresponding to the voltage down-tracking direction and electrically coupling the second terminal of the second unit capacitor of at least one of the capacitor pairs to a positive reference voltage to enable the capacitor pairs when being corresponding to the voltage up-tracking direction by using the set of digital codes by the capacitor switching circuit.

11. The analog-to-digital conversion method of claim 7, further comprising:

in the initial stage and according to the first comparison result, performing positive level-shifting on a larger one of the positive output voltage and the negative output voltage and performing negative level-shifting on a smaller one of the positive output voltage and the negative output voltage when the difference between the positive output voltage and the negative output voltage is within the predetermined range related to the reference voltage by the control circuit;

assigning the voltage down-tracking direction and the voltage up-tracking direction respectively to the positive capacitor array and the negative capacitor array when the positive output voltage is larger than the negative output voltage, assigning the voltage up-tracking direction and the voltage down-tracking direction respectively to the positive capacitor array and the negative capacitor array when the negative output voltage is larger than the positive output voltage, and switching a capacitor enabling combination of the positive capacitor array and the negative capacitor array according to the second comparison result in each of the switching stages after the initial stage by using the set of digital codes by the control circuit.

12. The analog-to-digital conversion method of claim 7, further comprising:

in the initial stage and according to the first comparison result, performing positive level-shifting on the positive output voltage and performing negative level-shifting on the negative output voltage when the difference between the positive output voltage and the negative output voltage is within the predetermined range related to the reference voltage by the control circuit such that the positive output voltage is larger than the negative output voltage;

assigning the voltage down-tracking direction and the voltage up-tracking direction respectively to the positive capacitor array and the negative capacitor array and switching a capacitor enabling combination of the positive capacitor array and the negative capacitor array according to the second comparison result in each of the switching stages after the initial stage by using the set of digital codes by the control circuit.

* * * * *